(12) United States Patent
Kaneko et al.

(10) Patent No.: US 10,103,515 B2
(45) Date of Patent: Oct. 16, 2018

(54) VERTICAL CAVITY SURFACE EMITTING LASER AND ATOMIC OSCILLATOR

(71) Applicant: Seiko Epson Corporation, Tokyo (JP)

(72) Inventors: Tsuyoshi Kaneko, Shimosuwa (JP); Tetsuo Nishida, Suwa (JP); Yuji Kurachi, Chino (JP)

(*) Notice: Subject to any disclaimer, the term of this patent is extended or adjusted under 35 U.S.C. 154(b) by 0 days.

(21) Appl. No.: 15/148,065

(22) Filed: May 6, 2016

(65) Prior Publication Data

US 2016/0248226 A1 Aug. 25, 2016

Related U.S. Application Data

(63) Continuation of application No. 14/573,293, filed on Dec. 17, 2014, now Pat. No. 9,360,845.

(30) Foreign Application Priority Data

Dec. 20, 2013 (JP) .................................. 2013-263458

(51) Int. Cl.
*H01S 5/00* (2006.01)
*H01S 5/187* (2006.01)
(Continued)

(52) U.S. Cl.
CPC .............. *H01S 5/187* (2013.01); *G04F 5/145* (2013.01); *H01S 5/1835* (2013.01);
(Continued)

(58) Field of Classification Search
CPC .... H01S 5/187; H01S 5/3432; H01S 5/18313; H01S 5/1835; H01S 5/18352;
(Continued)

(56) References Cited

U.S. PATENT DOCUMENTS 6,134,251 A 10/2000 Kawase et al.
6,570,905 B1 5/2003 Ebeling
(Continued)

FOREIGN PATENT DOCUMENTS

CN 103208992 A 7/2013
JP 2001-189525 A 7/2001
(Continued)

OTHER PUBLICATIONS

F. Monti di Sopra et al. ("Polarization Control in Strained T-bar VCSELs," IEEE Photonics Technology Letters, vol. 14, No. 8, Aug 2002.*
(Continued)

*Primary Examiner* — Yuanda Zhang
(74) *Attorney, Agent, or Firm* — Harness, Dickey & Pierce, P.L.C.

(57) ABSTRACT

A vertical cavity surface emitting laser includes: a substrate; and a laminated body which is provided over the substrate, wherein the laminated body includes a first mirror layer provided over the substrate, an active layer provided over the first mirror layer, and a second mirror layer provided over the active layer, in a plan view, the laminated body includes a first portion having a first width, a second portion having a second width, and a third portion which is provided between the first portion and the second portion and has a third width wider than the first width or the second width, and a resin layer which covers at least one portion of the first portion is provided.

20 Claims, 9 Drawing Sheets

(51) Int. Cl.
*G04F 5/14* (2006.01)
*H01S 5/183* (2006.01)
*H03L 7/26* (2006.01)
*H01S 5/343* (2006.01)
*H01S 5/042* (2006.01)

(52) U.S. Cl.
CPC ...... *H01S 5/18313* (2013.01); *H01S 5/18352* (2013.01); *H01S 5/3432* (2013.01); *H03L 7/26* (2013.01); *H01S 5/0421* (2013.01); *H01S 5/0425* (2013.01); *H01S 5/18333* (2013.01)

(58) Field of Classification Search
CPC .. H01S 5/0421; H01S 5/0425; H01S 5/18333; G04F 5/145; H03L 7/26
See application file for complete search history.

(56) References Cited

U.S. PATENT DOCUMENTS

| | | | |
|---|---|---|---|
| 6,751,242 | B2 | 6/2004 | Kaneko et al. |
| 7,333,522 | B2 | 2/2008 | Ostermann et al. |
| 2001/0026567 | A1 | 10/2001 | Kaneko et al. |
| 2005/0169336 | A1 | 8/2005 | Ishii et al. |
| 2005/0199896 | A1* | 9/2005 | Kaneko ................. B82Y 20/00 257/96 |
| 2006/0002440 | A1 | 1/2006 | Nagawa et al. |
| 2006/0187997 | A1* | 8/2006 | Ezaki ................... H01S 5/18355 372/99 |
| 2011/0116147 | A1* | 5/2011 | Motomura ............... B41J 2/473 359/204.1 |
| 2011/0170155 | A1* | 7/2011 | Jikutani ................. B82Y 20/00 359/204.4 |
| 2013/0176080 | A1 | 7/2013 | Nishida |
| 2014/0152393 | A1* | 6/2014 | Motomura .......... H01S 5/18377 331/94.1 |
| 2014/0285271 | A1 | 9/2014 | Nishida |

FOREIGN PATENT DOCUMENTS

| | | |
|---|---|---|
| JP | 2003-008142 A | 1/2003 |
| JP | 3482824 B2 | 1/2004 |
| JP | 2005-252240 A | 9/2005 |
| JP | 2006-019498 A | 1/2006 |
| JP | 2013-098606 A | 5/2013 |

OTHER PUBLICATIONS

F. Monti Di Sopra et al., "Polarization Control in Strainted T-bar VCSELs", IEEE Photonics Technology Letters, vol. 14, No. 8, p. 1034-1036 (Aug. 2002).

* cited by examiner

VERTICAL CAVITY SURFACE EMITTING LASER AND ATOMIC OSCILLATOR

CROSS-REFERENCE TO RELATED APPLICATIONS

This application is a continuation of U.S. patent application Ser. No. 14/573,293, filed Dec. 17, 2014, which claims priority to Japanese Patent Application No. 2013-263458, filed Dec. 20, 2013, the entire disclosures of which are expressly incorporated by reference herein in their entireties.

BACKGROUND

1. Technical Field

The present invention relates to a vertical cavity surface emitting laser and an atomic oscillator.

2. Related Art

The vertical cavity surface emitting laser (VCSEL) is, for example, used as a light source of the atomic oscillator using coherent population trapping (CPT) which is one of the quantum interference effects.

In the vertical cavity surface emitting laser, a resonator generally has an isotropic structure, and accordingly it is difficult to control a polarization direction of laser light emitted from the resonator. JP-A-2001-189525, for example, discloses a vertical cavity surface emitting laser which includes an insulation layer which is formed to come in contact with an outer surface of a vertical resonator and has an anisotropic stress, and controls a polarization direction of laser light with this anisotropic stress.

However, in the vertical cavity surface emitting laser disclosed in JP-A-2001-189525, the insulation layer is only provided on the side surface of the vertical resonator. Accordingly, in the vertical cavity surface emitting laser disclosed in JP-A-2001-189525, the stress applied to the vertical resonator is not sufficient, and thus the polarization direction of the laser light may not be stabilized.

SUMMARY

An advantage of some aspects of the invention is to provide a vertical cavity surface emitting laser which can stabilize a polarization direction. In addition, another advantage of some aspects of the invention is to provide an atomic oscillator including the vertical cavity surface emitting laser.

An aspect of the invention is directed to a vertical cavity surface emitting laser including: a substrate; and a laminated body which is provided over the substrate, in which the laminated body includes a first mirror layer provided over the substrate, an active layer provided over the first mirror layer, and a second mirror layer provided over the active layer, in a plan view, the laminated body includes a first portion having a first width, a second portion having a second width, and a third portion which is provided between the first portion and the second portion and has a third width wider than the first width or the second width, and a resin layer which covers at least one portion of the first portion is provided.

According to the vertical cavity surface emitting laser, it is possible to increase the stress to be applied to the third portion by the first portion due to contraction of the resin layer, and it is possible to generate a large amount of distortion in the active layer of the third portion. Accordingly, in the vertical cavity surface emitting laser, it is possible to stabilize a polarization direction of laser light.

In the description according to the invention, for example, when a phrase "over" is used in a sentence such as "to form a specific element (hereinafter, referred to as a "B") over another specific element (hereinafter, referred to as an "A")", the phrase "over" is used to include a case of forming the B directly on the A and a case of forming the B on the A with another element interposed therebetween.

In the vertical cavity surface emitting laser according to the aspect of the invention, the resin layer may be provided on at least an upper surface of the one portion of the first portion, at least a first side surface of the one portion of the first portion which is connected to the upper surface, and at least a second side surface of the one portion of the first portion which is connected to the upper surface.

According to the vertical cavity surface emitting laser with this configuration, it is possible to stabilize the polarization direction.

In the vertical cavity surface emitting laser according to the aspect of the invention, the resin layer may cover the one portion of the first portion.

According to the vertical cavity surface emitting laser with this configuration, a lead-out wiring connected to an electrode for injecting current to the active layer can come in contact with the first portion. Accordingly, in the vertical cavity surface emitting laser, it is possible to increase a contact area of a conductive portion configured with the electrode and the lead-out wiring, and the laminated body. Therefore, it is possible to decrease contact resistance between the conductive portion and the laminated body.

In the vertical cavity surface emitting laser according to the aspect of the invention, the resin layer may be provided on an upper surface of the one portion of the first portion, on a first side surface of the one portion of the first portion which is connected to the upper surface, and a second side surface of the one portion of the first portion which is connected to the upper surface.

According to the vertical cavity surface emitting laser with this configuration, it is possible to stabilize the polarization direction.

In the vertical cavity surface emitting laser according to the aspect of the invention, the resin layer may cover the entire first portion.

According to the vertical cavity surface emitting laser with this configuration, it is possible to further increase the stress to be applied to the third portion by the first portion.

In the vertical cavity surface emitting laser according to the aspect of the invention, the resin layer may be provided on the entire upper surface of the first portion and the entire side surfaces of the first portion.

According to the vertical cavity surface emitting laser with this configuration, it is possible to stabilize the polarization direction.

In the vertical cavity surface emitting laser according to the aspect of the invention, the resin layer may be provided on the entire side surfaces of the laminated body, at least one portion of an upper surface of the first portion, and at least one portion of an upper surface of the second portion.

According to the vertical cavity surface emitting laser with this configuration, it is possible to stabilize the polarization direction.

In the vertical cavity surface emitting laser according to the aspect of the invention, the one portion of the upper surface of the first portion may be positioned on an end of the first portion, and the one portion of the upper surface of the second portion may be positioned on an end of the second portion.

According to the vertical cavity surface emitting laser with this configuration, it is possible to stabilize the polarization direction.

In the vertical cavity surface emitting laser according to the aspect of the invention, the resin layer may be provided on the entire upper surface of the first portion and the entire upper surface of the second portion.

According to the vertical cavity surface emitting laser with this configuration, it is possible to further increase the stress to be applied to the third portion by the first portion and the second portion.

In the vertical cavity surface emitting laser according to the aspect of the invention, the resin layer may not be provided on the entire upper surface of the third portion, and an electrode having an opening may be provided on the entire upper surface of the third portion.

According to the vertical cavity surface emitting laser with this configuration, it is possible to stabilize the polarization direction.

Another aspect of the invention is directed to a vertical cavity surface emitting laser including: a substrate; and a laminated body which is provided over the substrate, in which the laminated body includes a first mirror layer provided over the substrate, an active layer provided over the first mirror layer, and a second mirror layer provided over the active layer, in a plan view, the laminated body includes a first distortion imparting portion having a first width, a second distortion imparting portion having a second width, and a resonance portion which is provided between the first distortion imparting portion and the second distortion imparting portion, has a third width wider than the first width or the second width, and resonates light generated by the active layer, and a resin layer which covers at least one portion of the first distortion imparting portion is provided.

According to the vertical cavity surface emitting laser, it is possible to increase the stress to be applied to the resonance portion by the first distortion imparting portion due to contraction of the resin layer, and it is possible to generate a large amount of distortion in the active layer of the resonance portion. Therefore, in the vertical cavity surface emitting laser, it is possible to stabilize the polarization direction of the laser light.

In the vertical cavity surface emitting laser according to the aspect of the invention, the resin layer may be provided on at least an upper surface of the one portion of the first distortion imparting portion, at least a first side surface of the one portion of the first distortion imparting portion which is connected to the upper surface, and at least a second side surface of the one portion of the first distortion imparting portion which is connected to the upper surface.

According to the vertical cavity surface emitting laser with this configuration, it is possible to stabilize the polarization direction.

In the vertical cavity surface emitting laser according to the aspect of the invention, the resin layer may cover the one portion of the first distortion imparting portion.

According to the vertical cavity surface emitting laser with this configuration, a lead-out wiring connected to an electrode for injecting current to the active layer can come in contact with the first distortion imparting portion. Accordingly, in the vertical cavity surface emitting laser, it is possible to increase a contact area of a conductive portion configured with the electrode and the lead-out wiring, and the laminated body. Therefore, it is possible to decrease contact resistance between the conductive portion and the laminated body.

In the vertical cavity surface emitting laser according to the aspect of the invention, the resin layer may be provided on an upper surface of the one portion of the first distortion imparting portion, a first side surface of the one portion of the first distortion imparting portion which is connected to the upper surface, and a second side surface of the one portion of the first distortion imparting portion which is connected to the upper surface.

According to the vertical cavity surface emitting laser with this configuration, it is possible to stabilize the polarization direction.

In the vertical cavity surface emitting laser according to the aspect of the invention, the resin layer may cover the entire first distortion imparting portion.

According to the vertical cavity surface emitting laser with this configuration, it is possible to further increase the stress to be applied to the resonance portion by the first distortion imparting portion.

In the vertical cavity surface emitting laser according to the aspect of the invention, the resin layer may be provided on the entire upper surface of the first distortion imparting portion and the entire side surfaces of the first distortion imparting portion.

According to the vertical cavity surface emitting laser with this configuration, it is possible to stabilize the polarization direction.

In the vertical cavity surface emitting laser according to the aspect of the invention, the resin layer may be provided on the entire side surfaces of the laminated body, at least one portion of an upper surface of the first distortion imparting portion, and at least one portion of an upper surface of the second distortion imparting portion.

According to the vertical cavity surface emitting laser with this configuration, it is possible to stabilize the polarization direction.

In the vertical cavity surface emitting laser according to the aspect of the invention, the one portion of the upper surface of the first distortion imparting portion may be positioned on an end of the first distortion imparting portion, and the one portion of the upper surface of the second distortion imparting portion may be positioned on an end of the second distortion imparting portion.

According to the vertical cavity surface emitting laser with this configuration, it is possible to stabilize the polarization direction.

In the vertical cavity surface emitting laser according to the aspect of the invention, the resin layer may be provided on the entire upper surface of the first distortion imparting portion and the entire upper surface of the second distortion imparting portion.

According to the vertical cavity surface emitting laser with this configuration, it is possible to further increase the stress to be applied to the resonance portion by the first distortion imparting portion and the second distortion imparting portion.

In the vertical cavity surface emitting laser according to the aspect of the invention, the resin layer may not be provided on the entire upper surface of the resonance portion, and an electrode having an opening may be provided on the entire upper surface of the resonance portion.

According to the vertical cavity surface emitting laser with this configuration, it is possible to stabilize the polarization direction.

Still another aspect of the invention is directed to an atomic oscillator including the vertical cavity surface emitting laser according to the aspect of the invention.

According to the atomic oscillator, since the atomic oscillator includes the vertical cavity surface emitting laser according to the aspects of the invention, it is possible to stably emit circularly polarized light to the gas cell through a λ/4 plate, for example, and it is possible to increase frequency stability of the atomic oscillator.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail with reference to the drawings. The embodiments described below are not intended to unduly limit the contents of the invention disclosed in the aspects. All of the configurations described below are not limited to the essential constituent elements of the invention.

1. Vertical Cavity Surface Emitting Laser

Figure 1:
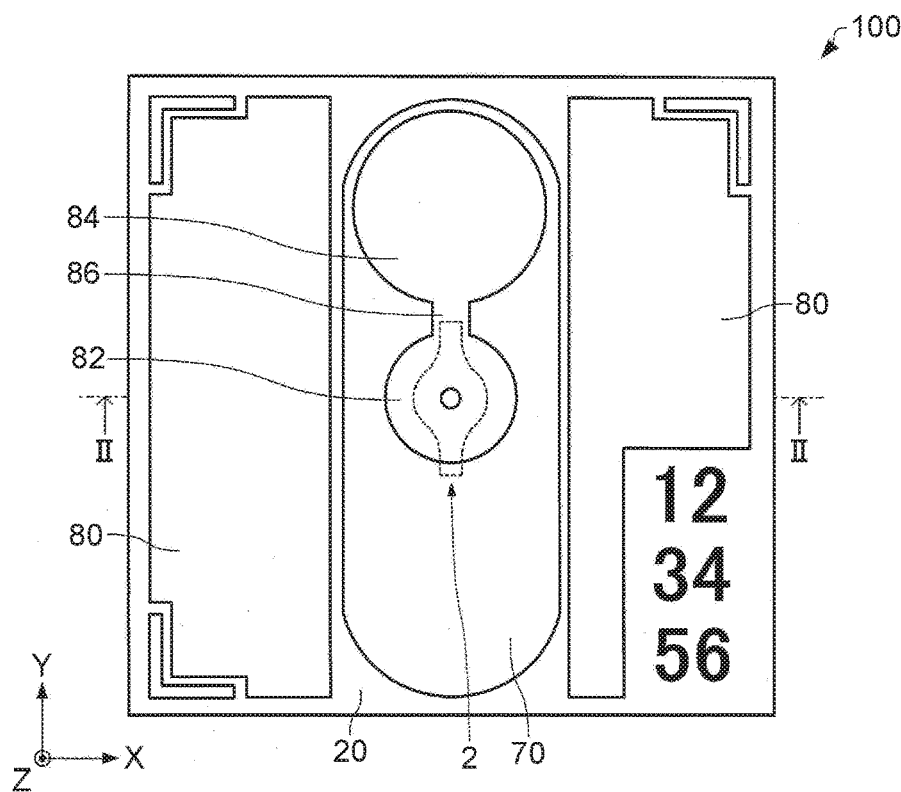
FIG. 1 is a plan view schematically showing a vertical cavity surface emitting laser according to the embodiment.
Figure 2:
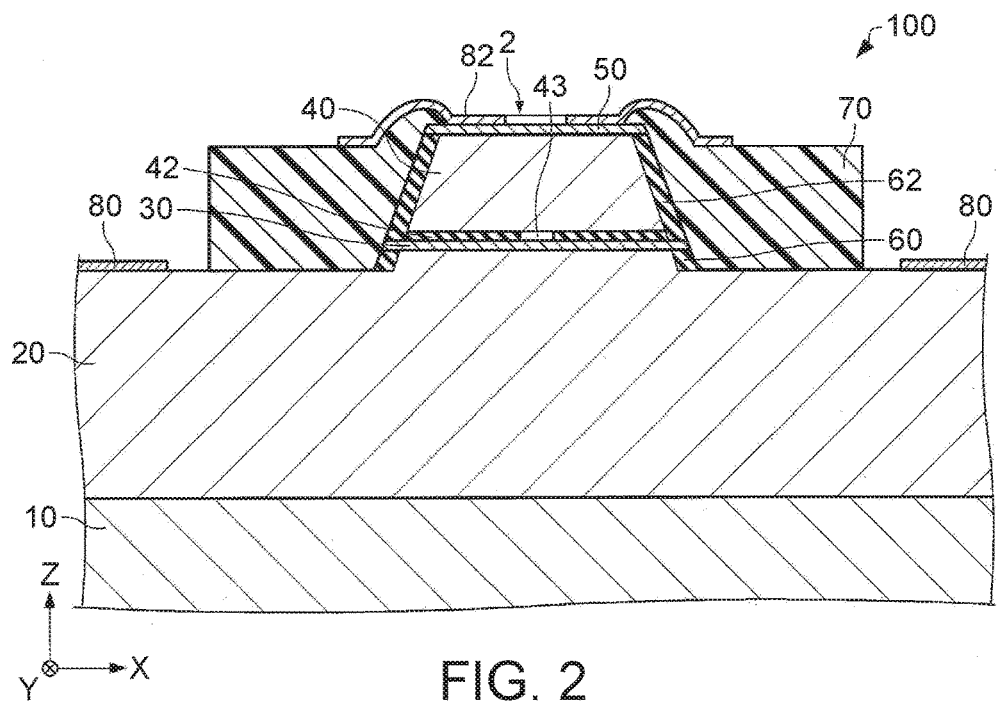
FIG. 2 is a cross-sectional view schematically showing a vertical cavity surface emitting laser according to the embodiment.
Figure 3:
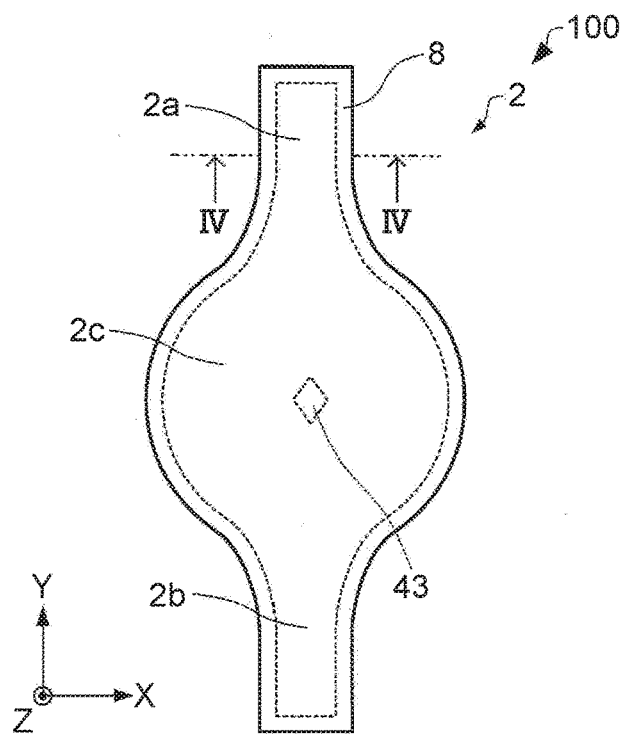
FIG. 3 is a plan view schematically showing a vertical cavity surface emitting laser according to the embodiment.
Figure 4:
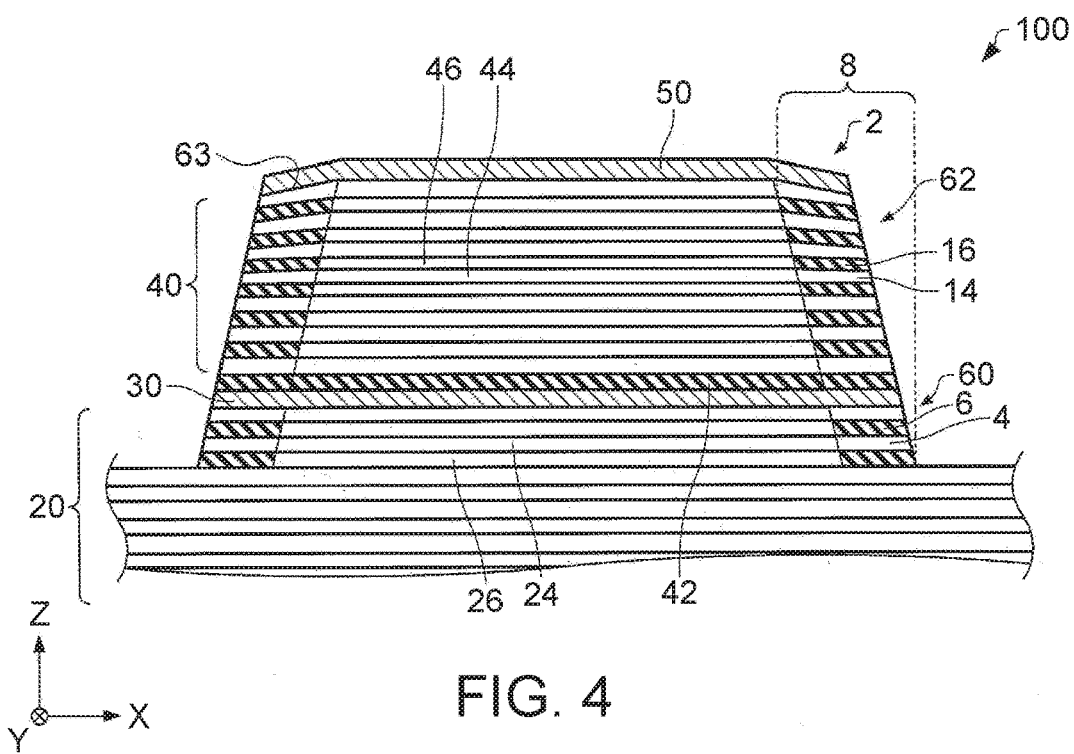
FIG. 4 is a cross-sectional view schematically showing a vertical cavity surface emitting laser according to the embodiment.

First, a vertical cavity surface emitting laser according to the embodiment will be described with reference to the drawings. FIG. 1 is a plan view schematically showing a vertical cavity surface emitting laser 100 according to the embodiment. FIG. 2 is a cross-sectional view which is taken along line II-II of FIG. 1 and schematically shows the vertical cavity surface emitting laser 100 according to the embodiment. FIG. 3 is a plan view schematically showing the vertical cavity surface emitting laser 100 according to the embodiment. FIG. 4 is a cross-sectional view which is taken along line IV-IV of FIG. 3 and schematically shows the vertical cavity surface emitting laser 100 according to the embodiment.

For the sake of convenience, FIG. 2 shows a simplified laminated body 2. In FIG. 3, members other than the laminated body 2 of the vertical cavity surface emitting laser 100 are omitted. FIGS. 1 to 4 show an X axis, a Y axis, and a Z axis as three axes orthogonal to each other.

As shown in FIGS. 1 to 4, the vertical cavity surface emitting laser 100 includes a substrate 10, a first mirror layer 20, an active layer 30, a second mirror layer 40, a current constriction layer 42, a contact layer 50, first areas 60, second areas 62, a resin layer 70, first electrodes 80, and second electrodes 82.

The substrate 10 is, for example, a first conductive (for example, n-type) GaAs substrate.

The first mirror layer 20 is formed on the substrate 10. The first mirror layer 20 is a first conductive semiconductor layer. As shown in FIG. 4, the first mirror layer 20 is a distribution Bragg reflection (DBR) type mirror in which high refractive index layers 24 and low refractive index layers 26 are laminated onto each other. The high refractive index layer 24 is, for example, an n-type $Al_{0.12}Ga_{0.88}As$ layer on which silicon is doped. The low refractive index layer 26 is, for example, an n-type $Al_{0.9}Ga_{0.1}As$ layer on which silicon is doped. The number (number of pairs) of laminated high refractive index layers 24 and low refractive index layers 26 is, for example, 10 pairs to 50 pairs, specifically, 40.5 pairs.

The active layer 30 is provided on the first mirror layer 20. The active layer 30, for example, has a multiple quantum well (MQW) structure in which three layers having a quantum well structure configured with an i-type $In_{0.06}Ga_{0.94}As$ layer and an i-type $Al_{0.3}Ga_{0.7}As$ layer are overlapped.

The second mirror layer 40 is formed on the active layer 30. The second mirror layer 40 is a second conductive (for example, p-type) semiconductor layer. The second mirror layer 40 is a distribution Bragg reflection (DBR) type mirror in which high refractive index layers 44 and low refractive index layers 46 are laminated onto each other. The high refractive index layer 44 is, for example, a p-type $Al_{0.15}Ga_{0.85}As$ layer on which carbon is doped. The low refractive index layer 46 is, for example, a p-type $Al_{0.9}Ga_{0.1}As$ layer on which carbon is doped. The number (number of pairs) of laminated high refractive index layers 44 and low refractive index layers 46 is, for example, 3 pairs to 40 pairs, specifically, 20 pairs.

The second mirror layer 40, the active layer 30, and the first mirror layer 20 configure a vertical resonator-type pin diode. When a forward voltage of the pin diode is applied between the electrodes 80 and 82, recombination between electrons and positive holes occurs in the active layer 30, and the light emitting occurs. The light generated in the active layer 30 reciprocates between the first mirror layer 20 and the second mirror layer 40 (multiple reflection), the induced emission occurs at that time, and the intensity is amplified. When an optical gain exceeds an optical loss, laser oscillation occurs, and the laser light is emitted in a vertical direction (a lamination direction of the first mirror layer 20 and the active layer 30) from the upper surface of the contact layer 50.

The current constriction layer 42 is provided between the first mirror layer 20 and the second mirror layer 40. In the example shown in the drawing, the current constriction layer 42 is provided on the active layer 30. The current constriction layer 42 can also be provided in the first mirror layer 20 or the second mirror layer 40. In this case as well, the current constriction layer 42 is assumed to be provided between the first mirror layer 20 and the second mirror layer 40. The current constriction layer 42 is an insulation layer in which an opening 43 is formed. The current constriction layer 42 can prevent spreading of the current injected to a vertical resonator by the electrodes 80 and 82 in a planar direction (direction orthogonal to the lamination direction of the first mirror layer 20 and the active layer 30).

The contact layer 50 is provided on the second mirror layer 40. The contact layer 50 is a second conductive semiconductor layer. Specifically, the contact layer 50 is a p-type GaAs layer on which carbon is doped.

As shown in FIG. 4, the first areas 60 are provided on lateral portions of the first mirror layer 20 configuring the laminated body 2. The first areas 60 include a plurality of oxide layers 6 which are provided to be connected to the first mirror layer 20 (in the example shown in the drawing, a part of the first mirror layer 20). Specifically, first areas 60 are configured with the oxide layers 6 obtained by oxidizing layers connected to the low refractive index layers 26 (for example, $Al_{0.9}Ga_{0.1}As$ layers) configuring the first mirror layer 20, and layers 4 connected to the high refractive index layers 24 (for example, $Al_{0.15}Ga_{0.85}As$ layers) configuring the first mirror layer 20 which are laminated on each other.

The second areas 62 are provided on lateral portions of the second mirror layer 40 configuring the laminated body 2. The second areas 62 include a plurality of oxide layers 16 which are provided to be connected to the second mirror layer 40. Specifically, the second areas 62 are configured with the oxide layers 16 obtained by oxidizing layers connected to the low refractive index layers 46 (for example, $Al_{0.9}Ga_{0.1}As$ layers) configuring the second mirror layer 40, and layers 14 connected to the high refractive index layers 44 (for example, $Al_{0.15}Ga_{0.85}As$ layers) configuring the second mirror layer 40 which are laminated on each other. In a plan view, oxide areas 8 are configured by the first areas 60 and the second areas 62.

The first mirror layer 20, the active layer 30, the second mirror layer 40, the current constriction layer 42, the contact layer 50, the first areas 60, and the second areas 62 configure the laminated body 2. In the example shown in FIGS. 1 and 2, the laminated body 2 is surrounded with the resin layer 70.

In the example shown in FIG. 3, in a plan view (when seen from the lamination direction of the first mirror layer 20 and the active layer 30), a length of the laminated body 2 in a Y axis direction is longer than a length of the laminated body 2 in an X axis direction. That is, a longitudinal direction of the laminated body 2 is the Y axis direction. In a plan view, the laminated body 2 is, for example, symmetrical about a virtual straight line which passes through the center of the laminated body 2 and is parallel to the X axis. In a plan view, the laminated body 2 is, for example, symmetrical about a virtual straight line which passes through the center of the laminated body 2 and is parallel to the Y axis.

In a plan view as shown in FIG. 3, the laminated body 2 includes a first distortion imparting portion (first portion) 2a, a second distortion imparting portion (second portion) 2b, and a resonance portion (third portion) 2c.

In a plan view, the first distortion imparting portion 2a and the second distortion imparting portion 2b face each other in the Y axis direction with the resonance portion 2c interposed therebetween. In a plan view, the first distortion imparting portion 2a is protruded from the resonance portion 2c in the positive Y axis direction. In a plan view, the second distortion imparting portion 2b is protruded from the resonance portion 2c in the negative Y axis direction. The first distortion imparting portion 2a and the second distortion imparting portion 2b are provided to be integrated with the resonance portion 2c.

The first distortion imparting portion 2a and the second distortion imparting portion 2b impart distortion to the active layer 30 and polarize light generated in the active layer 30. Herein, to polarize the light is to set a vibration direction of an electric field of the light to be constant. The semiconductor layers (the first mirror layer 20, the active layer 30, the second mirror layer 40, the current constriction layer 42, the contact layer 50, the first areas 60, and the second areas 62) configuring the first distortion imparting portion 2a and the second distortion imparting portion 2b are a generation source which generates distortion to be imparted to the active layer 30. Since the first distortion imparting portion 2a and the second distortion imparting portion 2b include the first areas 60 including the plurality of oxide layers 6 and the second areas 62 including the plurality of oxide layers 16, it is possible to impart a large amount of distortion to the active layer 30.

The resonance portion 2c is provided between the first distortion imparting portion 2a and the second distortion imparting portion 2b. A length of the resonance portion 2c in the X axis direction is greater than a length of the first distortion imparting portion 2a in the X axis direction or a length of the second distortion imparting portion 2b in the X axis direction. A planar shape of the resonance portion 2c (shape when seen from the lamination direction of the first mirror layer 20 and the active layer 30) is, for example, a circle.

The resonance portion 2c resonates light generated in the active layer 30. That is, the vertical oscillator is formed in the resonance portion 2c.

The resin layer 70 is provided at least on side surfaces of the laminated body 2. In the example shown in FIG. 1, the resin layer 70 covers the first distortion imparting portion 2a and the second distortion imparting portion 2b. That is, the resin layer 70 is provided on the side surface of the first distortion imparting portion 2a, the upper surface of the first distortion imparting portion 2a, the side surface of the second distortion imparting portion 2b, and the upper surface of the second distortion imparting portion 2b. The resin layer 70 may completely cover the first distortion imparting portion 2a and the second distortion imparting portion 2b, or may cover some of the first distortion imparting portion 2a and the second distortion imparting portion 2b. The material of the resin layer 70 is, for example, polyimide.

In the example shown in FIG. 3, in a plan view, a length of the resin layer 70 in the Y axis direction is greater than a length of the resin layer 70 in the X axis direction. That is, a longitudinal direction of the resin layer 70 is the Y axis direction. The longitudinal direction of the resin layer 70 and the longitudinal direction of the laminated body 2 coincide with each other.

The first electrodes 80 are provided on the first mirror layer 20. The first electrodes 80 form ohmic contact with the first mirror layer 20. The first electrodes 80 are electrically connected to the first mirror layer 20. As the first electrodes 80, an electrode in which a Cr layer, an AuGe layer, an Ni layer, and an Au layer are laminated in this order from the first mirror layer 20 side is used, for example. The first electrodes 80 are the electrodes for injecting the current to the active layer 30. Although not shown, the first electrodes 80 may be provided on the lower surface of the substrate 10.

The second electrodes 82 are provided on the contact layer 50 (on the laminated body 2). The second electrodes 82 form ohmic contact with the contact layer 50. In the example shown in the drawing, the second electrodes 82 are also formed on the resin layer 70. The second electrodes 82 are electrically connected to the second mirror layer 40 through the contact layer 50. As the second electrodes 82, an electrode in which a Cr layer, a Pt layer, a Ti layer, a Pt layer, and an Au layer are laminated in this order from the contact layer 50 side is used, for example. The second electrodes 82 are the other electrodes for injecting the current to the active layer 30.

The second electrodes 82 are electrically connected to a pad 84. In the example shown in the drawing, the second electrodes 82 are electrically connected to the pad 84 through a lead-out wiring 86. The pad 84 is provided on the resin layer 70. The material of the pad 84 and the lead-out wiring 86 is, for example, the same as the material of the second electrodes 82.

Figure 5:
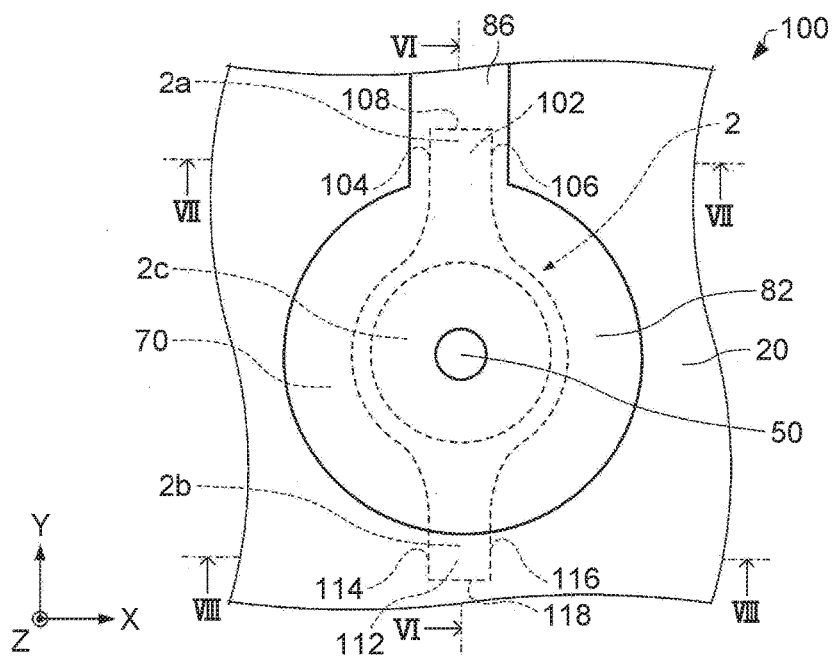
FIG. 5 is a plan view schematically showing a vertical cavity surface emitting laser according to the embodiment.
Figure 6:
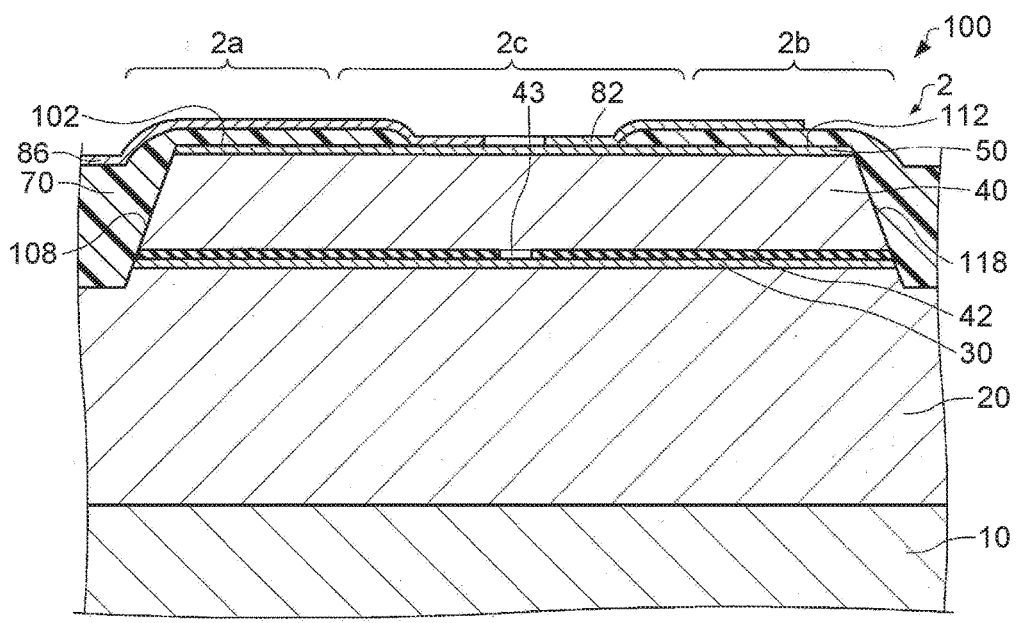
FIG. 6 is a cross-sectional view schematically showing a vertical cavity surface emitting laser according to the embodiment.
Figure 7:
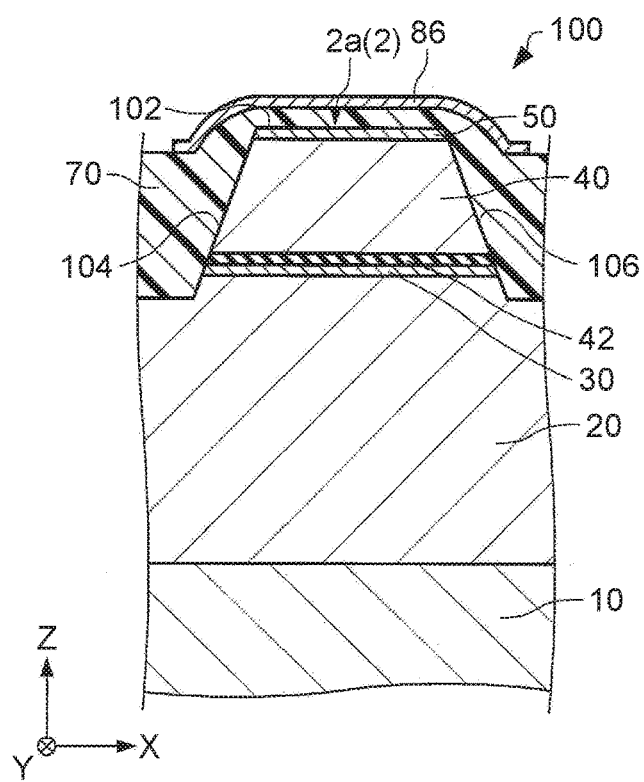
FIG. 7 is a cross-sectional view schematically showing a vertical cavity surface emitting laser according to the embodiment.
Figure 8:
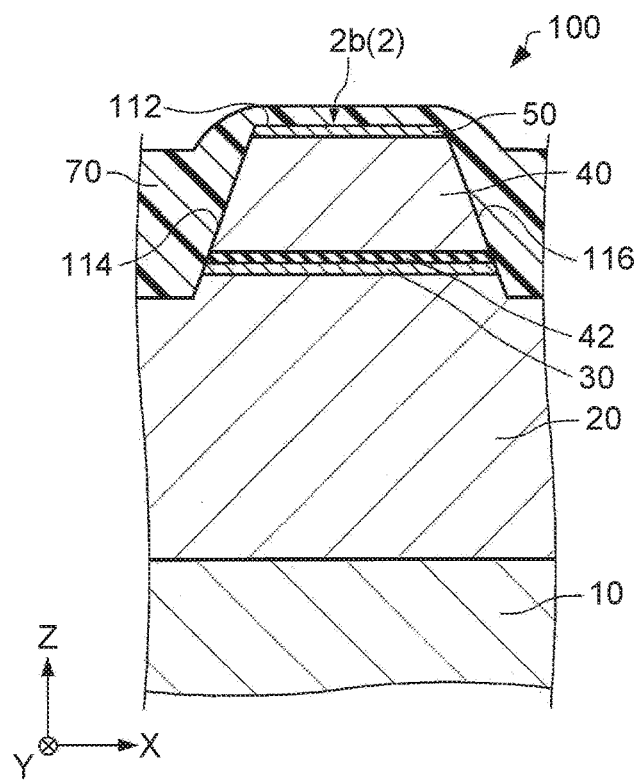
FIG. 8 is a cross-sectional view schematically showing a vertical cavity surface emitting laser according to the embodiment.

Herein, the laminated body 2 and the resin layer 70 will be described in detail. FIG. 5 is a plan view schematically showing the vertical cavity surface emitting laser 100 and is an enlarged view of the vicinity of the laminated body 2 shown in FIG. 2. FIG. 6 is a cross-sectional view which is taken along line VI-VI of FIG. 5 and schematically shows the vertical cavity surface emitting laser 100. FIG. 7 is a cross-sectional view which is taken along line VII-VII of FIG. 5 and schematically shows the vertical cavity surface emitting laser 100. FIG. 8 is a cross-sectional view which is taken along line VIII-VIII of FIG. 5 and schematically shows the vertical cavity surface emitting laser 100.

For the sake of convenience, FIGS. 5 to 8 show the simplified laminated body 2. FIGS. 5 to 8 show the X axis, the Y axis, and the Z axis as three axes orthogonal to each other.

The laminated body 2 is provided over the substrate 10. The laminated body 2 includes the first distortion imparting portion 2a having a first width (length in the X axis direction), the second distortion imparting portion 2b having a second width, and the resonance portion 2c having a third width wider than the first width and the second width. In the example shown in the drawing, the first width and the second width are the same width as each other.

The first width is, for example, a maximum width along the width of the first distortion imparting portion 2a, in a direction (X axis direction) orthogonal to a direction (Y axis direction) in which the first distortion imparting portion 2a and the second distortion imparting portion 2b face each other. The second width is, for example, a maximum width along the width of the second distortion imparting portion 2b, in the direction orthogonal to the direction in which the first distortion imparting portion 2a and the second distortion imparting portion 2b face each other. The third width is, for example, a maximum width along the width of the resonance portion 2c, in the direction orthogonal to the direction in which the first distortion imparting portion 2a and the second distortion imparting portion 2b face each other.

As shown in FIGS. 5 to 8, the first distortion imparting portion 2a includes an upper surface 102, a first side surface 104, a second side surface 106, and a third side surface 108. The side surfaces 104, 106, 108 are connected to the upper surface 102. The first side surface 104 is a side surface of the first distortion imparting portion 2a on the negative X axis direction side. The second side surface 106 is a side surface of the first distortion imparting portion 2a on the positive X axis direction side. The third side surface 108 is a side surface of the first distortion imparting portion 2a on the positive Y axis direction side. The third side surface 108 is connected to the first side surface 104 and the second side surface 106.

The second distortion imparting portion 2b includes an upper surface 112, a first side surface 114, a second side surface 116, and a third side surface 118. The side surfaces 114, 116, and 118 are connected to the upper surface 112. The first side surface 114 is a side surface of the second distortion imparting portion 2b on the negative X axis direction side. The second side surface 116 is a side surface of the second distortion imparting portion 2b on the positive X axis direction side. The third side surface 118 is a side surface of the second distortion imparting portion 2b on the negative Y axis direction side. The third side surface 118 is connected to the first side surface 114 and the second side surface 116.

The resin layer 70 covers at least a portion of the first distortion imparting portion 2a. That is, the resin layer 70 is provided on at least the upper surface 102 of a portion of the first distortion imparting portion 2a, at least the first side surface 104 of a portion of the first distortion imparting portion 2a, and at least the second side surface 106 of a portion of the first distortion imparting portion 2a. In the example shown in the drawing, the resin layer 70 covers the entire first distortion imparting portion 2a. Specifically, the resin layer 70 is provided on the entire upper surface 102, the entire first side surface 104, the entire second side surface 106, and the entire third side surface 108.

The resin layer 70 further covers at least a part of the second distortion imparting portion 2b. That is, the resin layer 70 is provided on at least the upper surface 112 of a portion of the second distortion imparting portion 2b, at least the first side surface 114 of a portion of the second distortion imparting portion 2b, and at least the second side surface 116 of a portion of the second distortion imparting portion 2b. In the example shown in the drawing, the resin layer 70 covers the entire second distortion imparting portion 2b. Specifically, the resin layer 70 is provided on the entire upper surface 112, the entire first side surface 114, the entire second side surface 116, and the entire third side surface 118.

In the example shown in the drawing, the resin layer 70 is provided on the entire side surface of the laminated body 2, at least a part of the upper surface 102 of the first distortion imparting portion 2a (specifically, the entire portion thereof), and at least a part of the upper surface 112 of the second distortion imparting portion 2b (specifically, the entire portion thereof).

The resin layer 70 is a resin which is hardened by applying heat, and contracts in a heating step (curing) of hardening the resin layer 70. In addition, the resin layer 70 contracts when returning the temperature in the heating step to a room temperature. A coefficient of thermal expansion of the resin layer 70 is greater than a coefficient of thermal expansion of the substrate 10 (approximately 6.5 when the substrate 10 is a GaAs substrate). Accordingly, the resin layer 70 easily contracts more than the substrate 10.

In the above description, the AlGaAs vertical cavity surface emitting laser has been described, but GaInP, ZnSSe, InGaN, AlGaN, InGaAs, GaInNAs, or GaAsSb semiconductor materials may be used according to the oscillation wavelength, for the vertical cavity surface emitting laser according to the invention.

The vertical cavity surface emitting laser 100, for example, has the following characteristics.

In the vertical cavity surface emitting laser 100, the laminated body 2 includes the first distortion imparting portion 2a, the second distortion imparting portion 2b, and the resonance portion 2c, and the resin layer 70 which covers at least a part of the first distortion imparting portion 2a is provided. Herein, the resin layer 70 is a resin which is hardened by applying heat, and contracts in a heating step (curing) of hardening the resin layer 70. In addition, the resin layer 70 contracts when returning the temperature in the heating step to a room temperature. In the vertical cavity surface emitting laser 100, it is possible to increase the stress to be applied to the resonance portion 2c by the first distortion imparting portion 2a with this contraction of the resin layer 70, and it is possible to generate a large amount of distortion in the active layer 30 of the resonance portion 2c. Accordingly, in the vertical cavity surface emitting laser 100, it is possible to stabilize the polarization direction of the laser light.

As described above, in the vertical cavity surface emitting laser 100, since it is possible to stabilize the polarization direction of the laser light, it is possible to stably emit circularly polarized light to the gas cell through a λ/4 plate, when the vertical cavity surface emitting laser 100 is used as a light source of the atomic oscillator, for example. As a result, it is possible to increase frequency stability of the atomic oscillator. Accordingly, it is possible to increase an occurrence probability of an EIT phenomenon. For example, when the polarization direction of the laser light emitted from the vertical cavity surface emitting laser is not stable, the light obtained through the λ/4 plate may be elliptically polarized light or a rotation direction of the circularly polarized light may be fluctuated.

As described above, in the vertical cavity surface emitting laser 100, since it is possible to stabilize the polarization direction of the laser light, it is possible to stably emit the circularly polarized light to the gas cell through the λ/4 plate, and to increase the frequency stability of the atomic oscillator.

In the vertical cavity surface emitting laser 100, the resin layer 70 covers the entire first distortion imparting portion 2a. Accordingly, in the vertical cavity surface emitting laser 100, it is possible to increase the stress to be applied to the resonance portion 2c by the first distortion imparting portion 2a, compared to a case where the resin layer 70 only covers a part of the first distortion imparting portion 2a.

In the vertical cavity surface emitting laser 100, the resin layer 70 is provided on the entire upper surface 102 of the first distortion imparting portion 2a and the entire upper surface 112 of the second distortion imparting portion 2b. Accordingly, in the vertical cavity surface emitting laser 100, it is possible to increase the stress to be applied to the resonance portion 2c by the distortion imparting portions 2a and 2b, compared to a case where the resin layer 70 only covers a part of the upper surfaces 102 and 112.

2. Manufacturing Method of Vertical Cavity Surface Emitting Laser

Next, a manufacturing method of the vertical cavity surface emitting laser according to the embodiment will be described with reference to the drawings. FIGS. 9 to 12 are cross-sectional views schematically showing manufacturing steps of the vertical cavity surface emitting laser 100 according to the embodiment, and correspond to FIG. 2.

Figure 9:
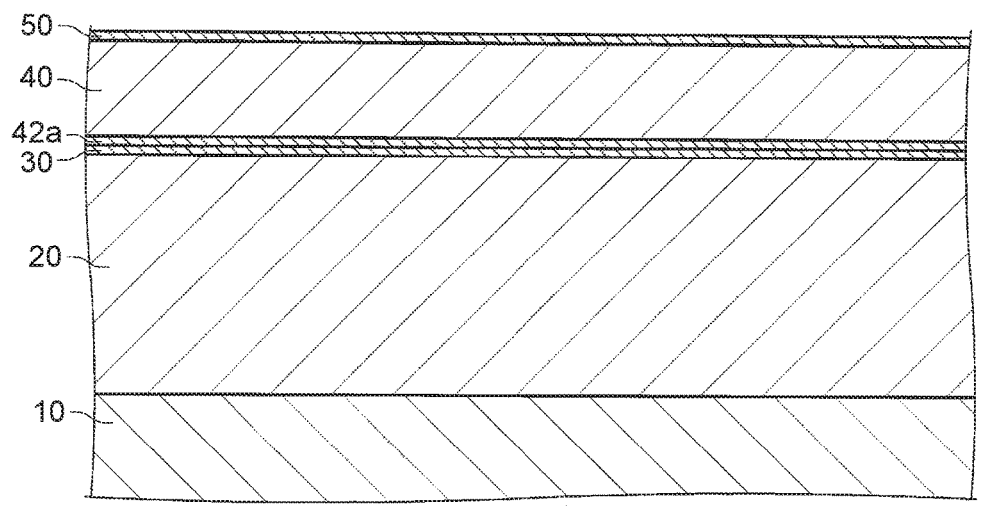
FIG. 9 is a cross-sectional view schematically showing a manufacturing step of a vertical cavity surface emitting laser according to the embodiment.

As shown in FIG. 9, the first mirror layer 20, the active layer 30, the layer to be oxidized 42a which is to be the oxidized current constriction layer 42, the second mirror layer 40, and the contact layer 50 are epitaxially grown in this order, on the substrate 10. As an epitaxial growth method, a metal organic chemical vapor deposition (MOCVD) method or a molecular beam epitaxy (MBE) method is used, for example.

Figure 10:
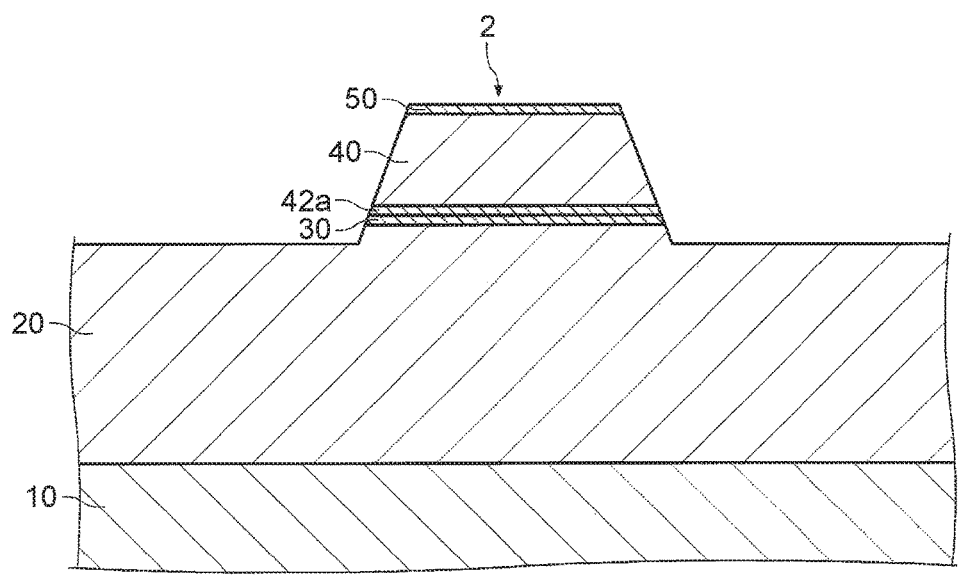
FIG. 10 is a cross-sectional view schematically showing a manufacturing step of a vertical cavity surface emitting laser according to the embodiment.

As shown in FIG. 10, the contact layer 50, the second mirror layer 40, the layer to be oxidized 42a, the active layer 30, and first mirror layer 20 are patterned to form the laminated body 2. The patterning is performed by photolithography or etching, for example.

Figure 11:
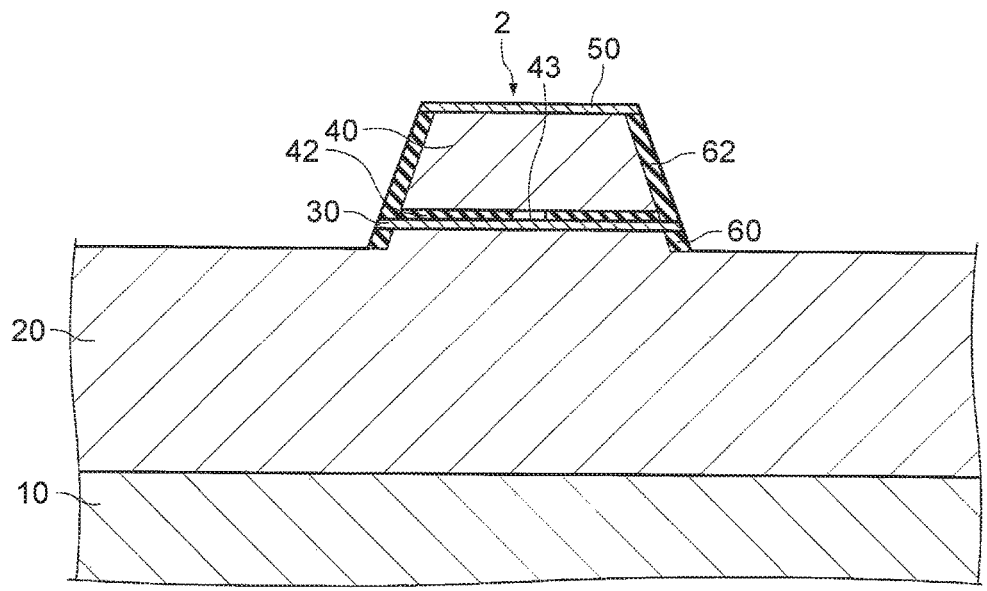
FIG. 11 is a cross-sectional view schematically showing a manufacturing step of a vertical cavity surface emitting laser according to the embodiment.

As shown in FIG. 11, the layer to be oxidized 42a is oxidized to form the current constriction layer 42. The layer to be oxidized 42a is, for example, an $Al_xGa_{1-x}As$ (x≥0.95) layer. The substrate 10 on which the laminated body 2 is formed is put in a steam atmosphere at approximately 400° C., to oxidize the $Al_xGa_{1-x}As$ (x≥0.95) layer from the lateral side, and accordingly the current constriction layer 42 is formed.

In the manufacturing method of the vertical cavity surface emitting laser 100, in the oxidization step, a layer configuring the first mirror layer 20 is oxidized from the lateral side to form the first area 60. A layer configuring the second mirror layer 40 is oxidized from the lateral side to form the second area 62. Specifically, due to the steam atmosphere at approximately 400° C., arsenic in the $Al_{0.9}Ga_{0.1}As$ layer configuring the mirror layers 20 and 40 is substituted with oxygen, and the areas 60 and 62 are formed. The areas 60 and 62, for example, contract when returning the temperature from the high temperature of approximately 400° C. to the room temperature, and the upper surface 63 of the second area 62 is inclined to the substrate 10 side (see FIG. 4). The first distortion imparting portion 2a and the second distortion imparting portion 2b can apply distortion (stress) caused by the contraction of the areas 60 and 62 to the active layer 30.

Figure 12:
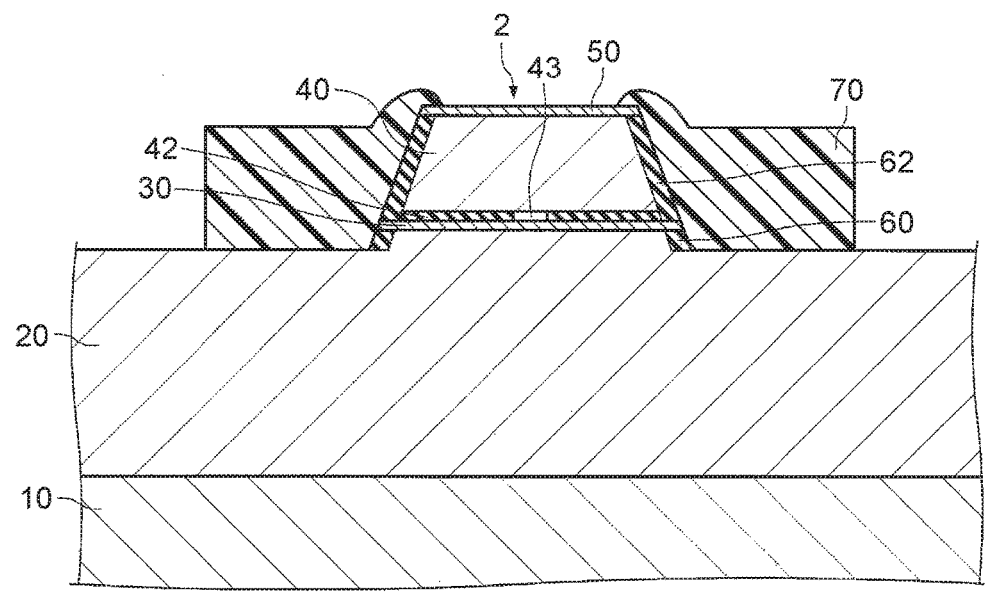
FIG. 12 is a cross-sectional view schematically showing a manufacturing step of a vertical cavity surface emitting laser according to the embodiment.

As shown in FIG. 12, the resin layer 70 is formed so as to surround the laminated body 2 and to cover the distortion imparting portions 2a and 2b. The resin layer 70 is formed, for example, by forming a layer formed of a polyimide resin on the upper surface of the first mirror layer 20 and the entire surface of the laminated body 2 using a spin coating method and patterning the layer. The patterning is performed by photolithography or etching, for example. Next, the resin layer 70 is hardened by performing a heating process (curing). The resin layer 70 contracts due to the heating process. In addition, the resin layer 70 contracts when returning the temperature in the heating step to a room temperature.

As shown in FIG. 2, the second electrode 82 is formed on the contact layer 50 and the resin layer 70, and the first electrode 80 is formed on the first mirror layer 20. The electrodes 80 and 82 are, for example, formed by a combination of a vacuum vapor deposition method and a lift-off method. The order of forming the electrodes 80 and 82 is not particularly limited. In the step of forming the second electrode 82, the pad 84 and the lead-out wiring 86 (see FIG. 1) may be formed.

It is possible to manufacture the vertical cavity surface emitting laser 100 with the steps described above.

3. Modification Example of Vertical Cavity Surface Emitting Laser

Figure 13:
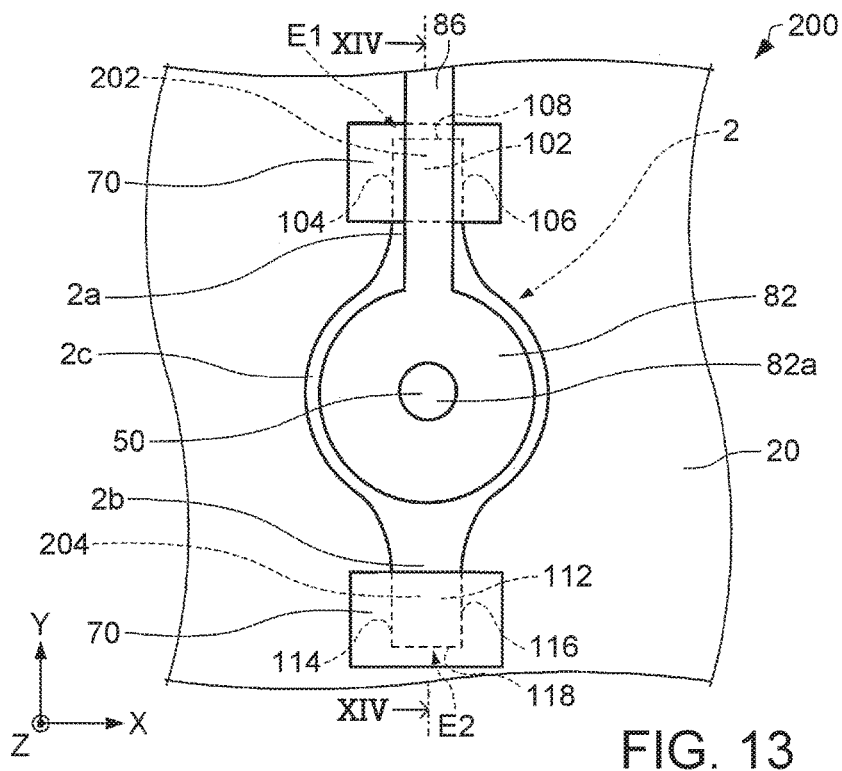
FIG. 13 is a plan view schematically showing a vertical cavity surface emitting laser according to a modification example of the embodiment.
Figure 14:
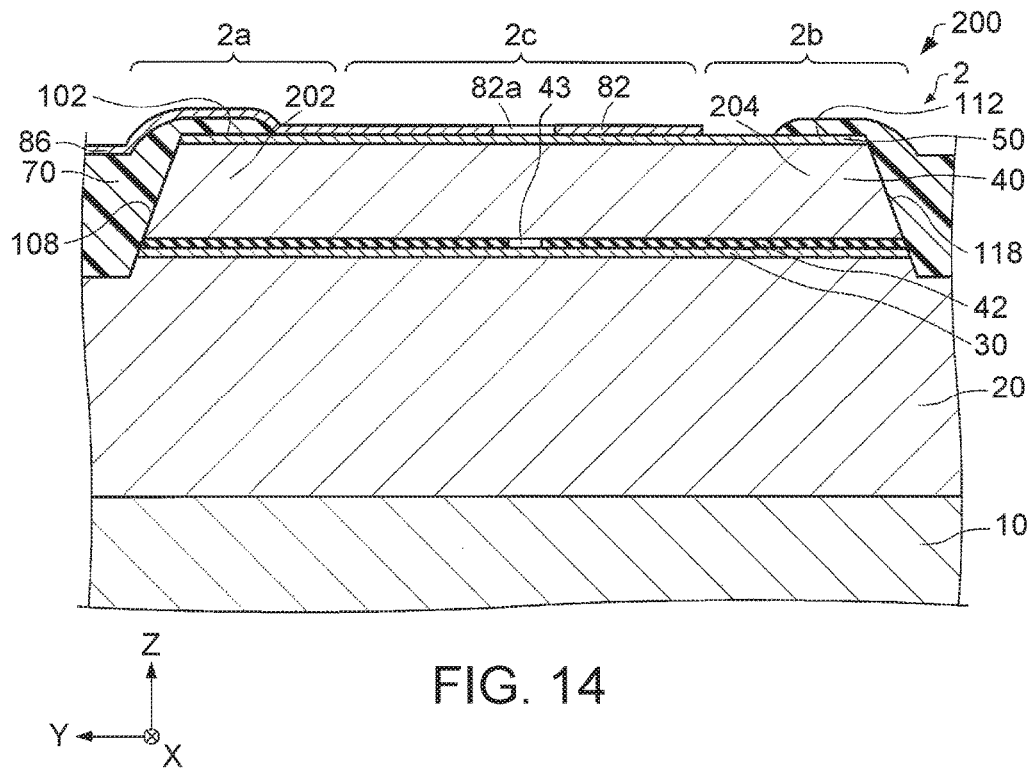
FIG. 14 is a cross-sectional view schematically showing a vertical cavity surface emitting laser according to a modification example of the embodiment.

Next, a vertical cavity surface emitting laser according to a modification example of the embodiment will be described with reference to the drawings. FIG. 13 is a plan view schematically showing a vertical cavity surface emitting laser 200 according to the modification example of the embodiment and corresponds to FIG. 5. FIG. 14 is a cross-sectional view which is taken along line XIV-XIV of FIG. 13 and schematically shows the vertical cavity surface emitting laser 200 according to the modification example of the embodiment. Hereinafter, the points of the vertical cavity surface emitting laser 200 different from the example of the vertical cavity surface emitting laser 100 described above will be described, and the overlapped description will be omitted.

For the sake of convenience, FIGS. 13 and 14 show the simplified laminated body 2. FIGS. 13 and 14 show the X axis, the Y axis, and the Z axis as three axes orthogonal to each other.

As shown in FIGS. 5 and 6, in the vertical cavity surface emitting laser 100, the resin layer 70 is provided on the entire side surfaces of the laminated body 2, the entire upper surface 102 of the first distortion imparting portion 2a, and the entire upper surface 112 of the second distortion imparting portion 2b.

Meanwhile, as shown in FIGS. 13 and 14, in the vertical cavity surface emitting laser 200, the resin layer 70 covers one portion 202 of the first distortion imparting portion 2a. That is, the resin layer 70 is provided on the upper surface 102 of the one portion 202 of the first distortion imparting portion 2a, the first side surface 104 of the one portion 202 of the first distortion imparting portion 2a, and the second side surface 106 of the one portion 202 of the first distortion imparting portion 2a. In the example shown in the drawing, the resin layer 70 is further provided on the third side surface 108 of the one portion 202 of the first distortion imparting portion 2a. The one portion 202 of the upper surface 102 of the first distortion imparting portion 2a is positioned on an end (end on the positive Y axis direction side) E1 of the first distortion imparting portion 2a.

In the vertical cavity surface emitting laser 200, the resin layer 70 covers one portion 204 of the second distortion imparting portion 2b. That is, the resin layer 70 is provided on the upper surface 112 of the one portion 204 of the second distortion imparting portion 2b, the first side surface 114 of the one portion 204 of the second distortion imparting portion 2b, and the second side surface 116 of the one portion 204 of the second distortion imparting portion 2b. In the example shown in the drawing, the resin layer 70 is further provided on the third side surface 118 of the one portion 204 of the second distortion imparting portion 2b. The one portion 204 of the upper surface 112 of the second distortion imparting portion 2b is positioned on an end (end on the negative Y axis direction side) E2 of the second distortion imparting portion 2b.

In the vertical cavity surface emitting laser 200, the resin layer 70 is not provided on the entire upper surface of the resonance portion 2c. That is, the resin layer 70 is not provided on the upper surface of the resonance portion 2c. The second electrode 82 including an opening 82a is provided on the entire upper surface of the resonance portion 2c. In a plan view, the second electrode 82 is provided in the inner side of the outer rim of the laminated body 2. The lead-out wiring 86 connected to the second electrode 82 comes in contact with the contact layer 50 of the first distortion imparting portion 2a. The resin layer 70 is provided to extend, on the lower portion of the lead-out wiring 86. The lower portion of the lead-out wiring 86 may be insulated from the other portion, and accordingly, the other insulation layer may be provided, instead of the resin layer 70.

As described above, in the vertical cavity surface emitting laser 200, the resin layer 70 covers the one portion 202 of the first distortion imparting portion 2a. Accordingly, in the vertical cavity surface emitting laser 200, the lead-out wiring 86 can come in contact with the contact layer 50 of the first distortion imparting portion 2a (contact layer 50 of the first distortion imparting portion 2a excluding the one portion 202). Therefore, in the vertical cavity surface emitting laser 200, it is possible to increase a contact area of a conductive portion and the contact layer 50, compared to a case where the conductive portion configured with the second electrode 82 and the lead-out wiring 86 only comes in contact with the contact layer 50 of the resonance portion 2c. Thus, it is possible to decrease contact resistance between the conductive portion and the contact layer 50.

Figure 15:
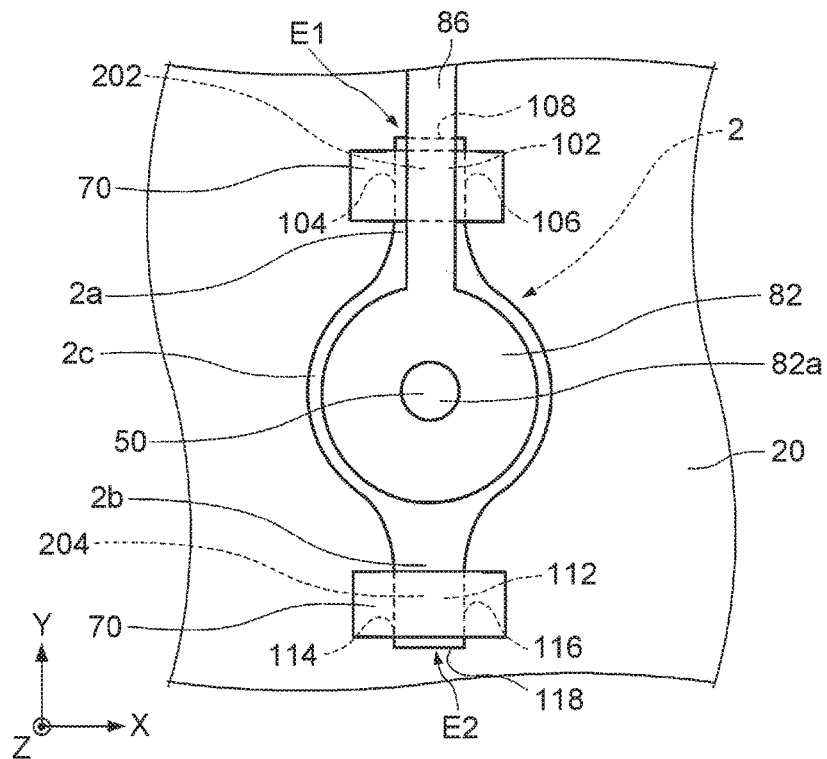
FIG. 15 is a plan view schematically showing a vertical cavity surface emitting laser according to a modification example of the embodiment.

As shown in FIG. 15, the resin layer 70 may not be provided on the third side surface 108 of the first distortion imparting portion 2a and the third side surface 118 of the second distortion imparting portion 2b. That is, the one portion 202 of the first distortion imparting portion 2a may not be provided on the end E1 of the first distortion imparting portion 2a, and the one portion 204 of the second distortion imparting portion 2b may not be provided on the end E2 of the second distortion imparting portion 2b. In this case, an insulation layer (not shown) is, for example, provided between the lead-out wiring 86 and the first mirror layer 20.

4. Atomic Oscillator

Figure 16:
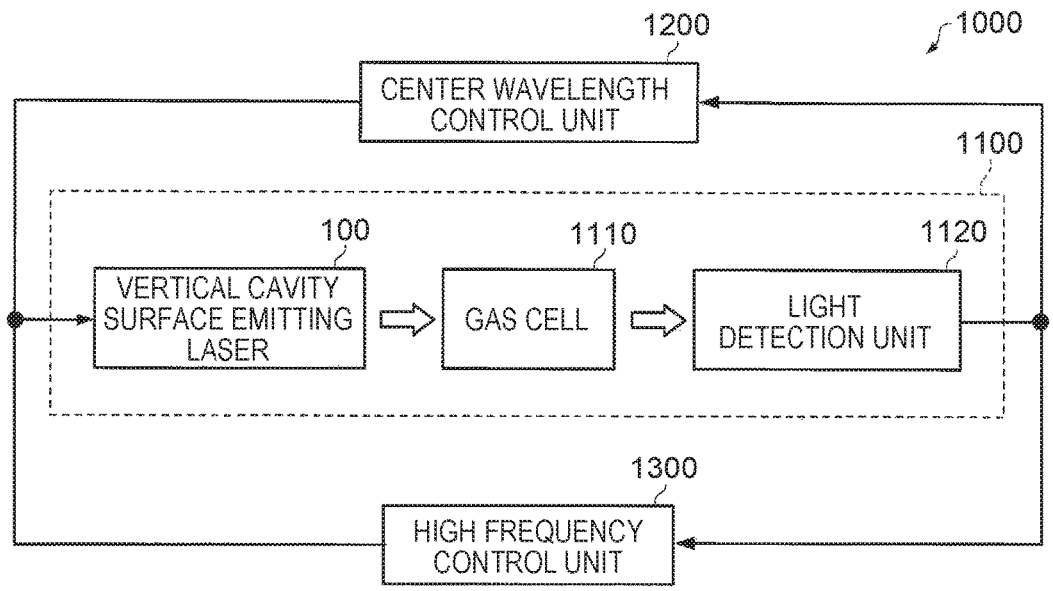
FIG. 16 is a functional block diagram of an atomic oscillator according to the embodiment.

Next, an atomic oscillator according to the embodiment will be described with reference to the drawings. FIG. 16 is a functional block diagram of an atomic oscillator 1000 according to the embodiment.

As shown in FIG. 16, the atomic oscillator 1000 is configured to include an optical module 1100, a center wavelength control unit 1200, and a high frequency control unit 1300.

The optical module 1100 includes the vertical cavity surface emitting laser according to the invention (in the example shown in the drawing, the vertical cavity surface emitting laser 100), a gas cell 1110, and a light detection unit 1120.

Figure 17:
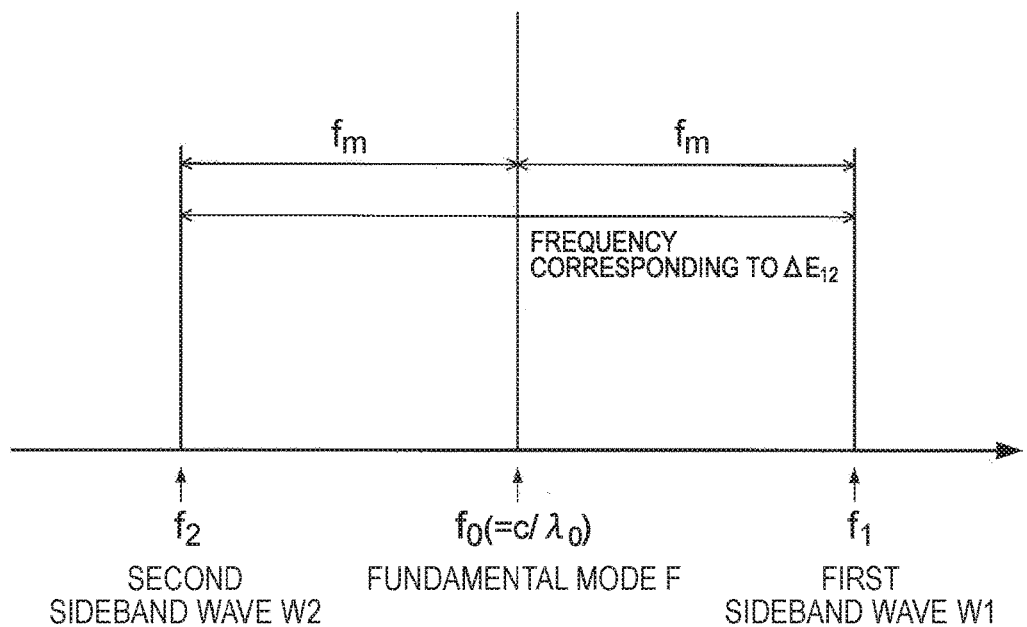
FIG. 17 is a view showing frequency spectra of resonant light.
Figure 18:
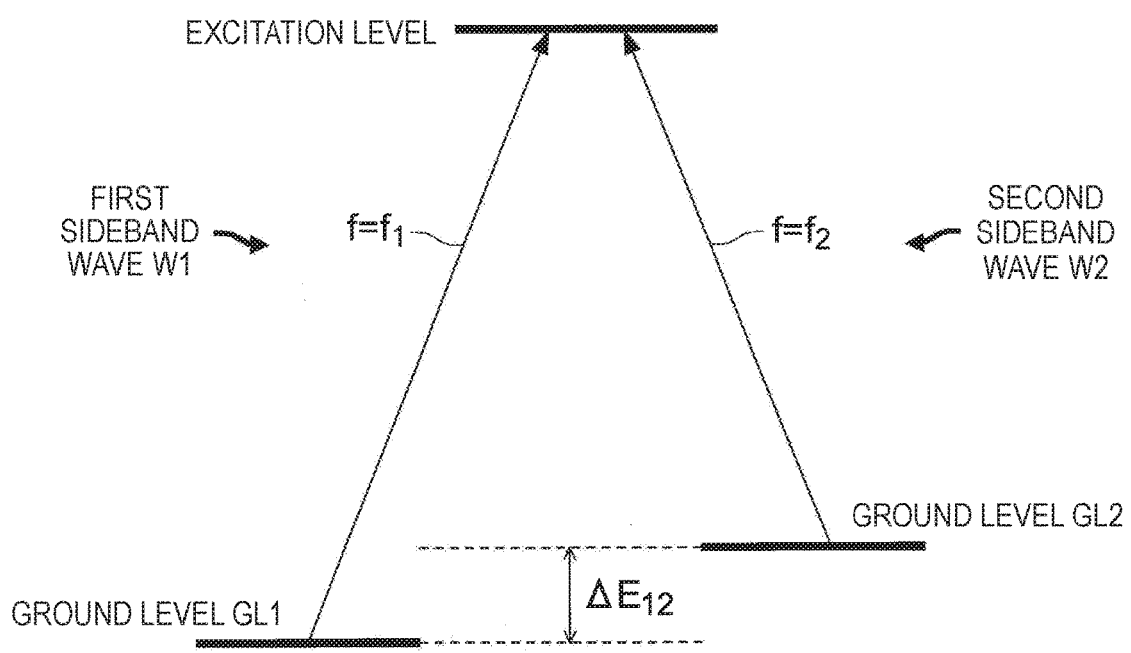
FIG. 18 is a view showing a relationship between Λ-shaped three level models of an alkaline metal atom, a first sideband wave, and a second sideband wave.

FIG. 17 is a view showing frequency spectra of light emitted by the vertical cavity surface emitting laser 100. FIG. 18 is a view showing a relationship between Λ-shaped three level models of an alkaline metal atom, a first sideband wave W1, and a second sideband wave W2. The light emitted from the vertical cavity surface emitting laser 100 includes a fundamental mode F including a center frequency $f_0$ (=$c/\lambda_0$: c represents velocity of light and $\lambda_0$ represents a center wavelength of laser light), the first sideband wave W1 including a frequency $f_1$ in an upstream sideband with respect to the center frequency $f_0$, and the second sideband wave W2 including a frequency $f_2$ in an downstream sideband with respect to the center frequency $f_0$, shown in FIG. 17. The frequency $f_1$ of the first sideband wave W1 satisfies $f_1 = f_0 + f_m$, and the frequency $f_2$ of the second sideband wave W2 satisfies $f_2 = f_0 - f_m$.

As shown in FIG. 18, a difference in frequencies between the frequency $f_1$ of the first sideband wave W1 and the frequency $f_2$ of the second sideband wave W2 coincides with a frequency corresponding to a difference in energy $\Delta E_{12}$ between a ground level GL1 and a ground level GL2 of the alkaline metal atom. Accordingly, the alkaline metal atom causes an EIT phenomenon to occur due to the first sideband wave W1 including the frequency $f_1$ and the second sideband wave W2 including the frequency $f_2$.

In the gas cell 1110, a gaseous alkaline metal atom (sodium atom, rubidium atom, cesium atom, and the like) is sealed in a container. When two light waves including the frequency (wavelength) corresponding to the difference in energy between two ground levels of the alkaline metal atom is emitted to the gas cell 1110, the alkaline metal atom causes the EIT phenomenon to occur. For example, if the alkaline metal atom is a sodium atom, the frequency corresponding to the difference in energy between the ground level GL1 and the ground level GL2 in a D1 line is 9.19263 . . . GHz. Accordingly, when two light waves including the difference in frequency of 9.19263 . . . GHz is emitted, the EIT phenomenon occurs.

The light detection unit 1120 detects the intensity of the light penetrating the alkaline metal atom sealed in the gas cell 1110. The light detection unit 1120 outputs a detection signal according to the amount of the light penetrating the alkaline metal atom. As the light detection unit 1120, a photodiode is used, for example.

The center wavelength control unit 1200 generates driving current having a magnitude corresponding to the detection signal output by the light detection unit 1120, supplies the driving current to the vertical cavity surface emitting laser 100, and controls the center wavelength $\lambda_0$ of the light emitted by the vertical cavity surface emitting laser 100. The center wavelength $\lambda_0$ of the laser light emitted by the vertical cavity surface emitting laser 100 is minutely adjusted and stabilized, by a feedback loop passing through the vertical cavity surface emitting laser 100, the gas cell 1110, the light detection unit 1120, and the center wavelength control unit 1200.

The high frequency control unit 1300 controls so that the difference in wavelengths (frequencies) between the first sideband wave W1 and the second sideband wave W2 is equivalent to the frequency corresponding to the difference in energy between two ground levels of the alkaline metal atom sealed in the gas cell 1110, based on the detection result output by the light detection unit 1120. The high frequency control unit 1300 generates a modulation signal including a modulation frequency $f_m$ (see FIG. 17) according to the detection result output by the light detection unit 1120.

Feedback control is performed so that the difference in frequencies between the first sideband wave W1 and the second sideband wave W2 is extremely accurately equivalent to the frequency corresponding to the difference in energy between two ground levels of the alkaline metal atom, by a feedback loop passing through the vertical cavity surface emitting laser 100, the gas cell 1110, the light detection unit 1120, and the high frequency control unit 1300. As a result, the modulation frequency $f_m$ becomes an extremely stabilized frequency, and therefore, the modulation signal can be set as an output signal (clock signal) of the atomic oscillator 1000.

Next, the operations of the atomic oscillator 1000 will be described with reference to FIGS. 16 to 18.

The laser light emitted from the vertical cavity surface emitting laser 100 is incident to the gas cell 1110. The light emitted from the vertical cavity surface emitting laser 100 includes two light waves (the first sideband wave W1 and the second sideband wave W2) including the frequency (wavelength) corresponding to the difference in energy between two ground levels of the alkaline metal atom, and the alkaline metal atom causes the EIT phenomenon to occur. The intensity of the light penetrating the gas cell 1110 is detected by the light detection unit 1120.

The center wavelength control unit 1200 and the high frequency control unit 1300 perform the feedback control so that the difference in frequencies between the first sideband wave W1 and the second sideband wave W2 extremely accurately coincides with the frequency corresponding to the difference in energy between two ground levels of the alkaline metal atom. In the atomic oscillator 1000, a rapid change in a light absorbing behavior when the difference in frequencies $f_1-f_2$ between the first sideband wave W1 and the second sideband wave W2 is deviated from the frequency corresponding to the difference in energy $\Delta E_{12}$ between the ground level GL1 and the ground level GL2, is detected and controlled using the EIT phenomenon, and therefore it is possible to obtain an oscillator with high accuracy.

The embodiments and the modification examples are merely examples, and there is no limitation. For example, embodiments and the modification examples can also be suitably combined to each other.

The invention has configurations substantially same as the configurations described in the embodiments (for example, configurations with the same function, method, and effects, or configurations with the same object and effect). The invention includes a configuration in which non-essential parts of the configurations described in the embodiments are replaced. The invention includes a configuration having the same operation effect as the configurations described in the embodiments or a configuration which can achieve the same object. The invention includes a configuration obtained by adding a well-known technology to the configurations described in the embodiments.

What is claimed is:
1. A vertical cavity surface emitting laser comprising:
a substrate; and
a laminated body which protrudes from the substrate, the laminated body including;
   a first mirror layer,
   a second mirror layer,
   an active layer which is provided between the first mirror layer and the second mirror layer, and
   a plurality of oxide layers provided at lateral portions of the laminated body along a contour of the laminated body, the plurality of oxide layers being adjacent to the first mirror layer and the second mirror layer;
wherein the laminated body includes a first portion, a second portion, and a third portion, each of the first portion, second portion, and third portion including portions of the first mirror layer, the active layer, the second mirror layer, and the plurality of oxide layers,
in a plan view, the first portion and the second portion are opposed to each other via the third portion along a first direction,
the first portion has a first width in a second direction which is orthogonal to the first direction, the second portion has a second width in the second direction, the third portion has a third width in the second direction, and the third width is greater than the first width or the second width,
in a cross-sectional view along the second direction, the plurality of oxide layers are provided on opposing sides of each of the first portion, the second portion, and the third portion, and a distance between the plurality of oxide layers on the opposing sides of the third portion is greater than a distance between the plurality of oxide layers on opposing sides of the first portion, wherein, in a cross-sectional view along the second direction, a height of the first portion from the substrate in a direction orthogonal to the substrate across the plurality of oxide layers to an uppermost oxide layer of the plurality of oxide layers is less than a height of the first portion from the substrate in the direction orthogonal to the substrate to an uppermost surface of the second mirror layer.

2. The vertical cavity surface emitting laser according to claim 1, further comprising:

a covering layer covering one portion of the laminated body.

3. The vertical cavity surface emitting laser according to claim 2, wherein the covering layer is provided on an upper surface of the one portion of the first portion, a first side surface of the one portion of the first portion which is connected to the upper surface, and a second side surface of the one portion of the first portion which is connected to the upper surface.

4. The vertical cavity surface emitting laser according to claim 2, wherein the covering layer is provided on the entire upper surface of the first portion and the entire side surfaces of the first portion.

5. The vertical cavity surface emitting laser according to claim 2, wherein the covering layer is provided on the entire side surfaces of the laminated body, at least one portion of an upper surface of the first portion, and at least one portion of an upper surface of the second portion.

6. The vertical cavity surface emitting laser according to claim 5, wherein the one portion of the upper surface of the first portion is positioned on an end of the first portion, and the one portion of the upper surface of the second portion is positioned on an end of the second portion.

7. The vertical cavity surface emitting laser according to claim 2, wherein the covering layer is not provided on the entire upper surface of the third portion, and an electrode having an opening is provided on the entire upper surface of the third portion.

8. An atomic oscillator comprising:

the vertical cavity surface emitting laser according to claim 1.

9. The vertical cavity surface emitting laser according to claim 1, wherein the first mirror layer is provided between the substrate and the second mirror layer, in a cross-sectional view along the second direction, the first portion is tapered from the first mirror layer to the second mirror layer, and in the cross-sectional view along the second direction, the plurality of oxide layers are inclined along the tapered first portion.

10. The vertical cavity surface emitting laser according to claim 2, wherein, in a cross-sectional view, one side of the covering layer faces the one portion of the laminated body, and another side opposing of the covering layer opposing to the one side along the second direction does not face the laminated body.

11. A vertical cavity surface emitting laser comprising:

a substrate; and a laminated body which protrudes from the substrate, the laminated body comprising;

a first mirror layer, a second mirror layer, an active layer which is provided between the first mirror layer and the second mirror layer, and a plurality of oxide layers provided at lateral portions of the laminated body along a contour of the laminated body, the plurality of oxide layers being adjacent to the first mirror layer and the second mirror layer; and wherein the laminated body includes a first distortion imparting portion, a second distortion imparting portion, and a resonance portion which resonates light generated by the active layer, each of the first distortion imparting portion, the second distortion imparting portion, and the resonance portion including portions of the first mirror layer, the active layer, and the second mirror layer, in a plan view, the first distortion imparting portion and the second distortion imparting portion are opposed to each other via the resonance portion along a first direction, the first distortion imparting portion has a first width in a second direction which is orthogonal to the first direction, the second distortion imparting portion has a second width in the second direction, the resonance portion has a third width in the second direction, and the third width is greater than the first width or the second width, and a distance between the plurality of oxide layers on the opposing sides of the resonance portion is greater than a distance between the plurality of oxide layers on opposing sides of the first distortion imparting portion, wherein, in a cross-sectional view along the second direction, a height of the first distortion imparting portion from the substrate in a direction orthogonal to the substrate across the plurality of oxide layers to an uppermost oxide layer of the plurality of oxide layers is less than a height of the first distortion imparting portion from the substrate in the direction orthogonal to the substrate to an uppermost surface of the second mirror layer.

12. The vertical cavity surface emitting laser according to claim 11, further comprising:

a covering layer covering one portion of the laminated body.

13. The vertical cavity surface emitting laser according to claim 12, wherein the covering layer is provided on an upper surface of the one portion of the first distortion imparting portion, a first side surface of the one portion of the first distortion imparting portion which is connected to the upper surface, and a second side surface of the one portion of the first distortion imparting portion which is connected to the upper surface.

14. The vertical cavity surface emitting laser according to claim 12, wherein the covering layer is provided on the entire upper surface of the first distortion imparting portion and the entire side surfaces of the first distortion imparting portion.

15. The vertical cavity surface emitting laser according to claim 12, wherein the covering layer is provided on the entire side surfaces of the laminated body, at least one portion of an upper surface of the first distortion imparting portion, and at least one portion of an upper surface of the second distortion imparting portion.

16. The vertical cavity surface emitting laser according to claim 15,
wherein the one portion of the upper surface of the first distortion imparting portion is positioned on an end of the first distortion imparting portion, and
the one portion of the upper surface of the second distortion imparting portion is positioned on an end of the second distortion imparting portion.

17. The vertical cavity surface emitting laser according to claim 11,
wherein the first mirror layer is provided between the substrate and the second mirror layer,
in a cross-sectional view along the second direction, the first distortion imparting portion is tapered from the first mirror layer to the second mirror layer, and
in the cross-sectional view along the second direction, the plurality of oxide layers are inclined along the tapered first distortion imparting portion.

18. The vertical cavity surface emitting laser according to claim 12,
wherein, in a cross-sectional view, one side of the covering layer faces the one portion of the laminated body, and another side opposing of the covering layer opposing to the one side along the second direction does not face the laminated body.

19. A vertical cavity surface emitting laser comprising:
a substrate; and
a laminated body which protrudes from the substrate, the laminated body including;
a first mirror layer,
a second mirror layer,
an active layer which is provided between the first mirror layer and the second mirror layer, and
a plurality of oxide layers provided at lateral portions of the laminated body along a contour of the laminated body, the plurality of oxide layers being adjacent to the first mirror layer and the second mirror layer;
wherein the laminated body includes a first portion, a second portion, and a third portion, each of the first portion, second portion, and third portion including portions of the first mirror layer, the active layer, the second mirror layer, and the plurality of oxide layers,
in a plan view, the first portion and the second portion are opposed to each other via the third portion along a first direction,
the first portion has a first width in a second direction which is orthogonal to the first direction, the second portion has a second width in the second direction, the third portion has a third width in the second direction, and the third width is greater than the first width or the second width,
in a cross-sectional view along the second direction, the plurality of oxide layers are provided on opposing sides of each of the first portion, the second portion, and the third portion,
a distance between the plurality of oxide layers on the opposing sides of the third portion is greater than a distance between the plurality of oxide layers on opposing sides of the first portion,
the first mirror layer is provided between the substrate and the second mirror layer,
in a cross-sectional view along the second direction, the first portion is tapered from the first mirror layer to the second mirror layer, and
in the cross-sectional view along the second direction, the plurality of oxide layers are inclined along the tapered first portion.

20. A vertical cavity surface emitting laser comprising:
a substrate; and
a laminated body which protrudes from the substrate, the laminated body comprising;
a first mirror layer,
a second mirror layer,
an active layer which is provided between the first mirror layer and the second mirror layer, and
a plurality of oxide layers provided at lateral portions of the laminated body along a contour of the laminated body, the plurality of oxide layers being adjacent to the first mirror layer and the second mirror layer; and
wherein the laminated body includes a first distortion imparting portion, a second distortion imparting portion, and a resonance portion which resonates light generated by the active layer, each of the first distortion imparting portion, the second distortion imparting portion, and the resonance portion including portions of the first mirror layer, the active layer, and the second mirror layer,
in a plan view, the first distortion imparting portion and the second distortion imparting portion are opposed to each other via the resonance portion along a first direction,
the first distortion imparting portion has a first width in a second direction which is orthogonal to the first direction, the second distortion imparting portion has a second width in the second direction, the resonance portion has a third width in the second direction, and the third width is greater than the first width or the second width,
a distance between the plurality of oxide layers on the opposing sides of the resonance portion is greater than a distance between the plurality of oxide layers on opposing sides of the first distortion imparting portion,
the first mirror layer is provided between the substrate and the second mirror layer,
in a cross-sectional view along the second direction, the first distortion imparting portion is tapered from the first mirror layer to the second mirror layer, and
in the cross-sectional view along the second direction, the plurality of oxide layers are inclined along the tapered first distortion imparting portion.

* * * * *

UNITED STATES PATENT AND TRADEMARK OFFICE
CERTIFICATE OF CORRECTION

PATENT NO. : 10,103,515 B2
APPLICATION NO. : 15/148065
DATED : October 16, 2018
INVENTOR(S) : Tsuyoshi Kaneko et al.

Page 1 of 1

It is certified that error appears in the above-identified patent and that said Letters Patent is hereby corrected as shown below:

On the Title Page

Please insert:
--(73) Assignee: Seiko Epson Corporation--

Signed and Sealed this
Seventh Day of July, 2020

Andrei Iancu
*Director of the United States Patent and Trademark Office*